United States Patent [19]
Hollinger

[11] Patent Number: 5,434,095
[45] Date of Patent: * Jul. 18, 1995

[54] METHOD FOR CONTROLLING ELECTRICAL BREAKDOWN IN SEMICONDUCTOR POWER DEVICES

[75] Inventor: Theodore G. Hollinger, Bend, Oreg.

[73] Assignee: Sundstrand Corporation, Rockford, Ill.

[ * ] Notice: The portion of the term of this patent subsequent to Aug. 23, 2005 has been disclaimed.

[21] Appl. No.: 30,797

[22] Filed: Mar. 12, 1993

Related U.S. Application Data

[60] Division of Ser. No. 917,524, Jul. 17, 1992, Pat. No. 5,231,474, which is a continuation of Ser. No. 663,297, Feb. 28, 1991, abandoned, which is a continuation of Ser. No. 842,464, Mar. 21, 1986, abandoned.

[51] Int. Cl.⁶ .......................................... H01L 21/265
[52] U.S. Cl. ...................... 437/41; 148/DIG. 13; 148/DIG. 126; 148/DIG. 151
[58] Field of Search .............. 437/41; 148/DIG. 13, 148/126, 151; 257/335, 339

[56] References Cited

U.S. PATENT DOCUMENTS

| | | | |
|---|---|---|---|
| 3,458,781 | 7/1989 | Simon | 357/34 |
| 3,600,647 | 8/1971 | Gray | 357/23.6 |
| 4,101,922 | 7/1978 | Tihanyi et al. | 357/23.4 |
| 4,366,495 | 12/1982 | Goodman et al. | 357/23.4 |
| 4,376,286 | 8/1983 | Lidow et al. | 357/23 |
| 4,416,708 | 11/1983 | Abdoulin et al. | 148/187 |
| 4,499,652 | 2/1985 | Shrivastava | 29/571 |
| 4,596,068 | 6/1986 | Peters, Jr. | 437/41 |
| 4,599,118 | 7/1986 | Han et al. | 357/23.4 |
| 4,601,096 | 7/1986 | Calviello | 148/DIG. 88 |
| 4,656,492 | 4/1987 | Sunami et al. | 357/23.4 |
| 4,766,094 | 8/1988 | Hollinger | 437/164 |
| 5,015,596 | 5/1991 | Toyoda et al. | 148/DIG. 88 |
| 5,185,279 | 2/1993 | Ushiku | 437/41 |

FOREIGN PATENT DOCUMENTS

| | | | |
|---|---|---|---|
| 54-137985 | 10/1979 | Japan | 357/23.4 |
| 55-77174 | 6/1980 | Japan | 357/23.4 |
| 55-77174 | 6/1980 | Japan | 357/23.4 |
| 55-91874 | 7/1980 | Japan | 357/23.4 |
| 59-16379 | 1/1984 | Japan | 357/23.4 |
| 59-130473 | 7/1984 | Japan | 357/23.4 |
| 61-64165 | 4/1986 | Japan | 357/23.4 |
| 1390135 | 4/1975 | United Kingdom . | |

*Primary Examiner*—Olik Chaudhuri
*Assistant Examiner*—Long Pham
*Attorney, Agent, or Firm*—Marger, Johnson, McCollom & Stolowitz

[57] ABSTRACT

A field-effect, power-MOS transistor wherein a region under the gate contact pad is specially doped with a dopant that is electrically compatible with that in the transistor's channel to obviate problems of electrical breakdown in that region.

4 Claims, 13 Drawing Sheets

METHOD FOR CONTROLLING ELECTRICAL BREAKDOWN IN SEMICONDUCTOR POWER DEVICES

This application is a division of U.S. application Ser. No. 07/917,524, filed on Jul. 17, 1992, now U.S. Pat. No. 5,231,474, said application being a file wrapper continuation application of U.S. Ser. No. 07/663,297, filed Feb. 28, 1991, now abandoned, which is a file wrapper continuation application of Ser. No. 06/842,464, filed Mar. 21, 1986, now abandoned.

BACKGROUND AND SUMMARY OF THE INVENTION

This invention relates to a semiconductor device, and more particularly, to such a device which includes a specially doped region which is provided to prevent electrical breakdown under certain operating conditions. For the purpose of illustration, a preferred embodiment of the invention is described in conjunction with a field-effect, power-MOS type transistor wherein the invention has been found to have particular utility.

In the packaging of a semiconductor device, such as a field-effect, power-MOS transistor, it is, of course, necessary to make electrical contact (through leads) to the several electrodes (gate, source, drain) in the device. Presently, the best-available wire-bonding technology to achieve this requires, because of the relatively gross size of even the smallest wire which is practically handleable, enlarged bonding pad areas in a device to provide an appropriate contact expanse for a wire lead. In power-MOS transistors, one of such enlarged bonding areas is provided for the gate, and inclusion of such an area, under certain circumstances, presents both electrical and mechanical problems.

The invention disclosed and claimed herein relates to a structural modification, through special doping, in a semiconductor device to deal with the electrical problem. Another invention of mine, which is disclosed in a companion patent application Ser. No. 842,556, filed Mar. 21, 1986, now abandoned, for "Semiconductor Device with Anti-Fracture Support Structure" addresses the mechanical problems.

Turning attention now to the electrical problems just referred to, for a given desired operational switching voltage in, a device such as a field-effect, power-MOS transistor, there is a maximum allowable spacing between what might be thought of as the electrical breakdown-prone zones in order to assure that breakdown does not occur. In a device of the type just mentioned, the zones referred to take the form of the so-called channels in the device. In a typical power-MOS transistor, a region which is problematic is that region which extends as an expanse beneath the gate contact area, which region is at least partially bounded by channels whose separation greatly exceeds the maximum permissible spacing to prevent breakdown. For example, in a power-MOS transistor designed to operate with a switching voltage of 500-volts, the maximum allowable adjacent channel spacing is about 2-mils, yet in the gate contact area, it would be typical to find an adjacent channel spacing of about 10-30-mils. As was mentioned earlier, this greater spacing results as a consequence of having to provide a large enough contact area to enable a wire lead to fit.

Accordingly, a general object of the present invention is to provide an improved semiconductor structure which, while allowing wide spacing between breakdown-prone zones to accommodate lead attachment, nevertheless substantially completely solves and avoids the problem of electrical breakdown.

In accordance with a preferred embodiment of the invention, and as will be described more fully below, the invention proposes the inclusion of a specially doped region between such zones which, in effect, establishes an electrical connection with the zones in a manner which obviates electrical breakdown. In the case of a field-effect, power-MOS transistor, and referring for a moment specifically to what is known as an N-channel device where the channels contain a P-dopant, the invention includes a P-doped subregion extending between the adjacent channels underlying the gate contact area, which subregion makes an electrical connection, and preferably a conductive connection, between the channels. This solid-state structure eliminates the build-up and concentration of electrical fields which can cause debilitating electrical breakdown.

While there are certainly different ways in which such a specially doped subregion can be established, the description which follows below sets forth a preferred manner of creating such a subregion.

These and other objects and advantages which are attained by the invention will become more fully apparent as the description which now follows is read in conjunction with the accompanying drawings.

DETAILED DESCRIPTION OF THE INVENTION

Figure 1:
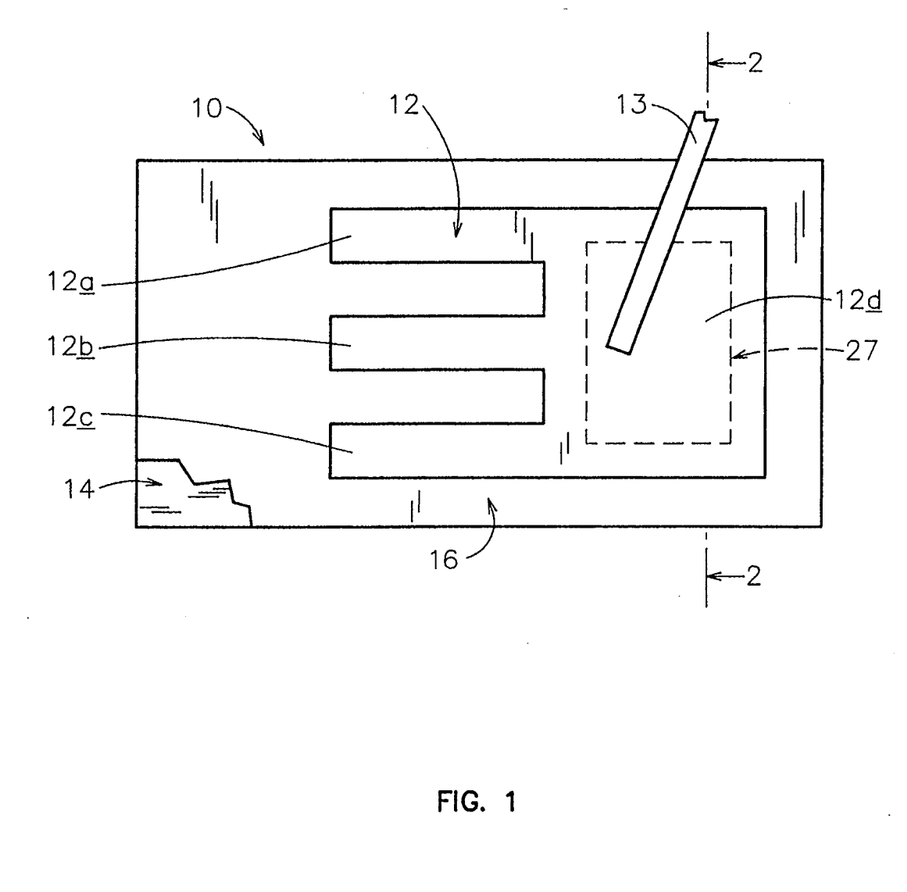
FIG. 1 is a simplified plan view, with a small portion broken away, illustrating a field-effect, power-MOS transistor (semiconductor device) which has been manufactured in accordance with the present invention.
Figure 2:
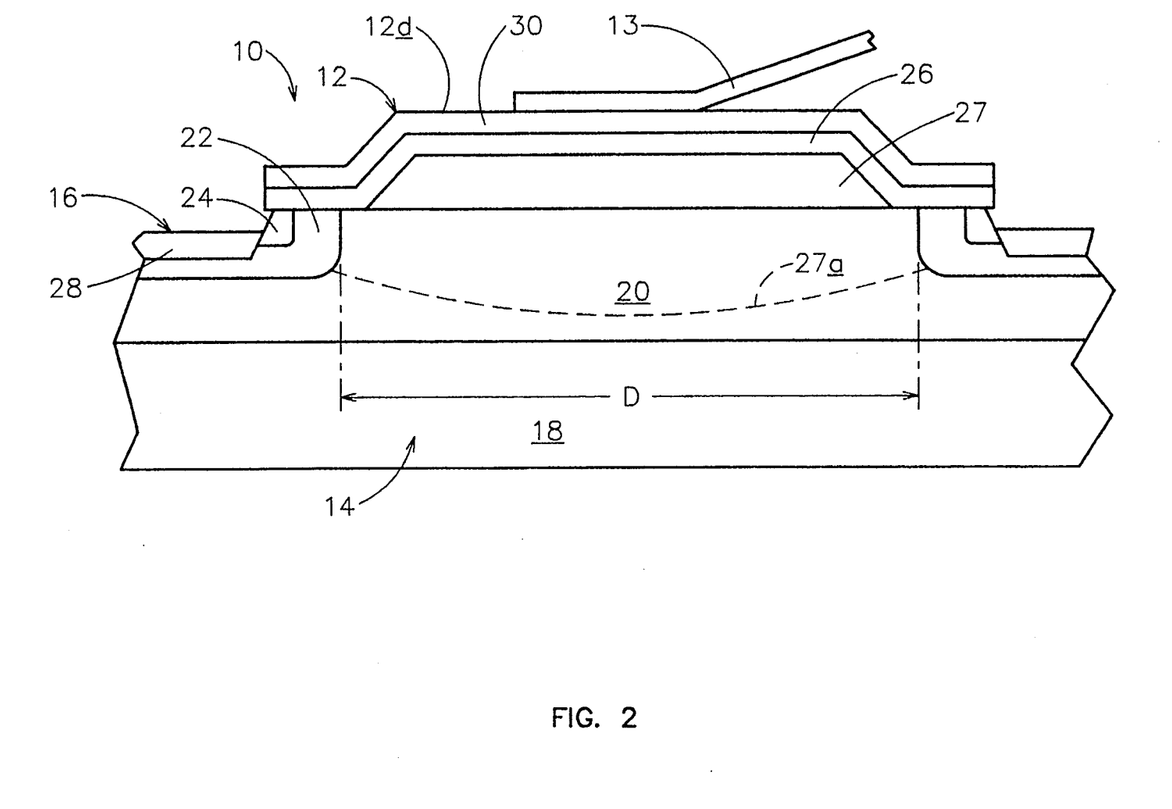
FIG. 2 is an enlarged fragmentary section through the device of FIG. 1, taken generally along line 2—2 in FIG. 1.
Figure 3:
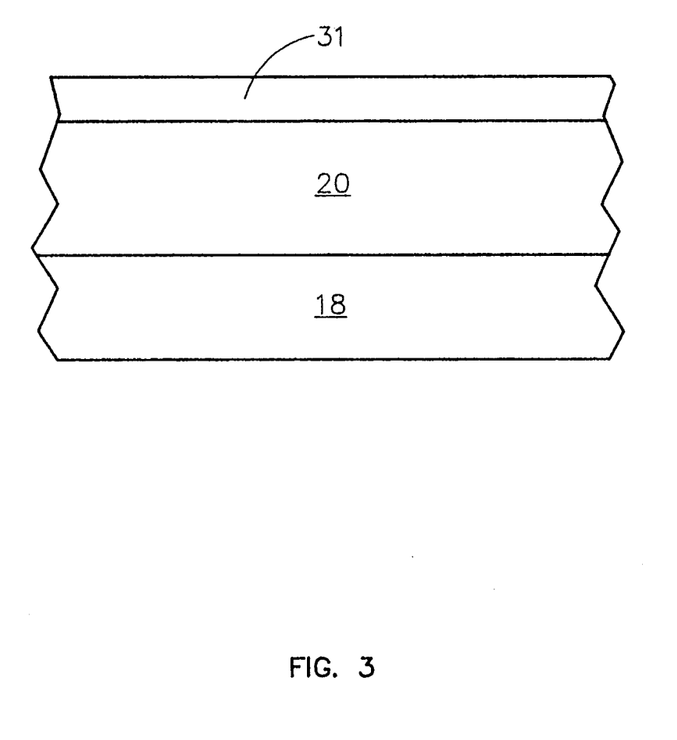
FIGS. 3-13, inclusive, illustrate successive stages in the manufacture of the FIG. 1 device, with certain ones of these figures illustrating a single manufacturing stage, and others, as will be explained, illustrating plural manufacturing stages.

Turning now to the drawings, and directing attention first to FIGS. 1 and 2, indicated generally at 10 is an N-channel, field-effect, power-MOS transistor (semiconductor device) which has been constructed in accordance with the present invention. Transistor 10, except as will be explained shortly, is otherwise typical in construction to like prior art devices, and includes a gate 12, a drain 14, and a source 16. In the particular transistor embodiment shown in these two figures, gate 12 includes three "fingers" 12a, 12b, 12c, and an enlarged bonding pad area 12d (gate contact area) to which a wire lead 13 is shown attached.

In the description which now immediately follows, certain dimensions are given. These dimensions are specific to a transistor designed to a act as a 500-volt switch.

As will be well understood by those skilled in the art, extending along and about the outline of gate 12, as the same is viewed in FIG. 1, is what is known as the "body" of the transistor which defines what is known as the channel in the transistor. In what might be thought of as the finger region under the gate, adjacent channels have a lateral spacing of about 1-mil which is well within the maximum allowable channel spacing of 2-mils, as dictated by the desired operating voltage for the transistor. However, in the region under bonding pad area, or, structure, 12d, laterally adjacent channels have a much greater spacing, namely about 12-mils, which far exceeds the maximum functionally allowable spacing. It is in this region where the transistor is prone to electrical breakdown, and accordingly, the laterally adjacent channels which at least partially bound this region are referred to herein as breakdown-prone zones.

Briefly reviewing now conventional aspects of transistor 10, and looking particularly for a moment at FIG. 2, one can clearly see the various layers and functional regions which make up the transistor. More specifically, in drain 14 there is a base N+ doped layer 18 and an N-doped epitaxial layer 20. Also included in the structure of transistor 10 is a P-doped layer 22 which forms the so-called "body" in the transistor, and residing therein an N+ doped layer 24 which forms the source in the transistor. Layers 22, 24, where they extend under gate 12, define the transistor's channel, and as can be seen in FIG. 2, the two adjacent channels which lie under opposite sides of area 12d shown in the figure are spaced apart by a distance D which, as mentioned earlier, is about 12-mils. This is a channel spacing situation which, but for the present invention, leads to electrical breakdown problems.

Continuing with a description of transistor 10, residing immediately above the last-mentioned three layers, except in the region under area 12d is a gate-oxide layer (silicon dioxide) 26, and two metalization layers 28, 30. These two metal layers are typically formed, and herein are formed, of aluminum. Layer 28 acts as an electrical contact for the source, and layer 30 forms previously mentioned gate 12.

Underlying gate-oxide layer 26 in the region beneath pad area 12d is an island 27 which, as seen in FIG. 1, has a rectangular outline, and which, as seen in FIG. 2, has an overbeveled margin where it extends downwardly from its upper surface in FIG. 2 toward the top surface of layer 20. Island 27, in addition to offering certain mechanical advantages which are discussed in my above-referred-to companion patent application, also acts as a convenient structure for introducing, into the region immediately therebelow in layer 20, also referred to herein as a subregion, a P-dopant which is compatible with (of the same type as) the dopant in layer 22. This doped subregion is indicated by dashed line 27a. As can be seen clearly in FIG. 2, doped subregion 27a has a penetration depth, relative to the top surface of layer 20, which is substantially the same as the penetration depth of layer 22. Further, at the locations where subregion 27a is adjacent layer 22, the same has a boundary profile which tends to flow smoothly with minor curvature to define a boundary interface connective structure with layer 22. Were subregion 27a substantially more penetrative than layer 22, and/or were the boundary interface regions of joinder with layer 22 sharply curved, electrical breakdown problems could still occur.

With subregion 27a located as shown, with a dopant having an N/P characteristic (herein P-) which is compatible with (of the same type as) the N/P characteristic of layer 22, electrical fields which exist during operation of transistor 10 under area 12d dispose field lines in such a manner that electrical breakdown is avoided. In effect, subregion 27a reduces to substantially zero the effective electrical distance between laterally adjacent channels under area 12d.

As was mentioned briefly above, while there are various ways of creating doped subregion 27a, island 27, as will now be explained more fully, provides a convenient mechanism for achieving this during the manufacture of transistor 10. So, turning attention now to FIGS. 3-13, inclusive, let us consider how transistor 10 has been formed with subregion 27a.

Layers 18, 20 reside in the usual commercially available silicon wafer, and may be thought of herein as forming the "starting material" for the manufacture of transistor 10. In the particular structure now being described, layer 18 has a thickness of about 15-mils and a resistivity of about 0.007–0.02-ohm-centimeters. Epitaxial layer 20 has a thickness of about 36–44-microns, and a resistivity of about 16–22-ohm-centimeters.

To begin with, and through any suitable technique, a doped glass (dielectric, oxide) layer 31 (see FIG. 3) with a thickness of about 7000-Angstroms is formed over layer 20. Preferably, the material making up layer 31 is the same (silicon dioxide) as that which is used to make gate-oxide layer 26. Dopant in layer 31, shown generally at 31a, must be electrically compatible with the dopant present in layer 22. While various dopant materials may be used for this purpose, the dopant chosen herein is the same as the dopant in layer 22—namely, boron. At this stage in the manufacture of transistor 10, dopant density in layer 31 is about 3% by weight Boron. As will become apparent, ultimately resulting island 27 comes out of layer 31.

Figure 4:
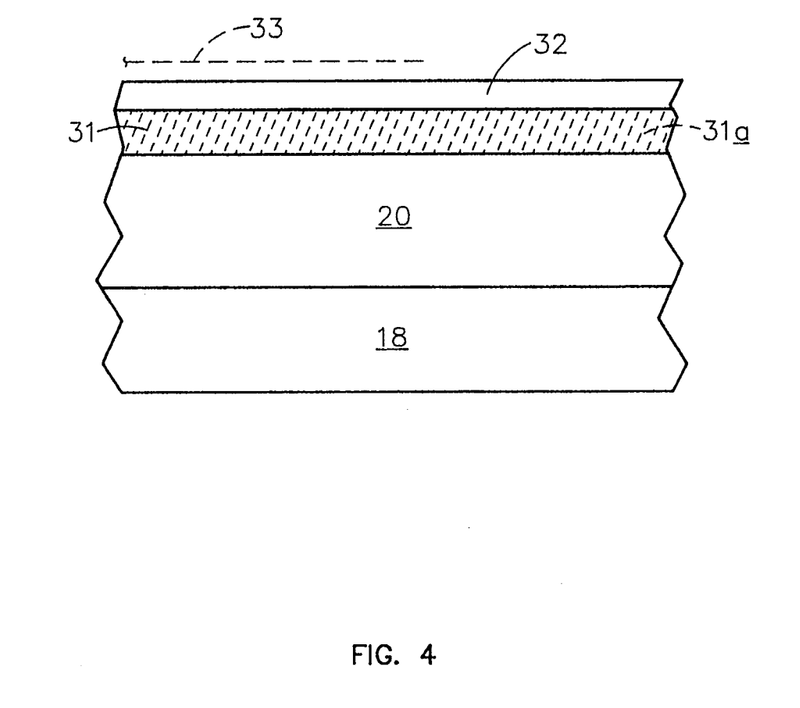

FIG. 4 illustrates the preparation, by any conventional pinhole-free technique, of a negative photoresist layer 32 over layer 31. Obviously, a positive photoresist layer could be employed if so desired. Next, a mask, such as that shown generally and fragmentarily at 33 in FIG. 4, is placed over layer 32 to create, through conventional photolithography techniques, the exact outline for what will end up becoming the upper surface of island 27.

Figure 5:
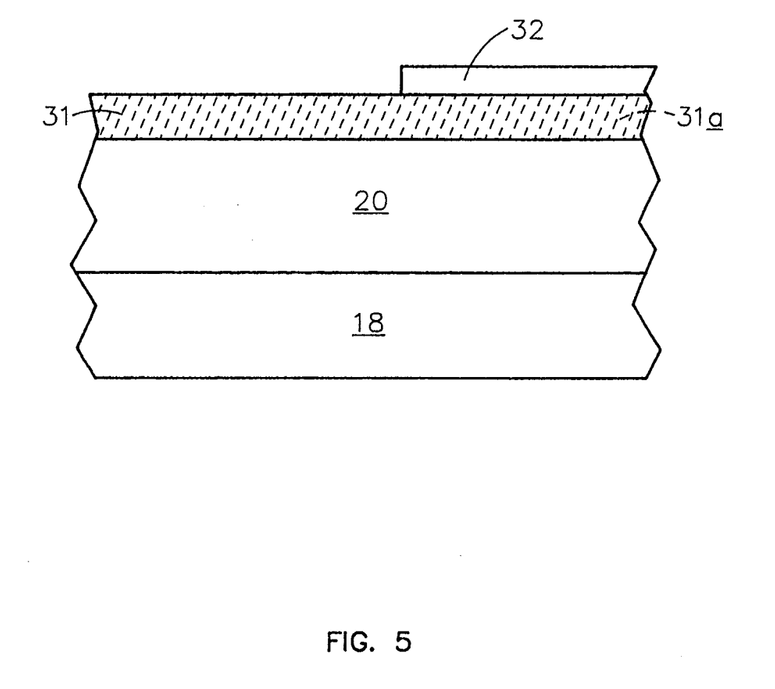

FIG. 5 shows the resulting structure after development of the light-exposed photoresist.

Figure 6:
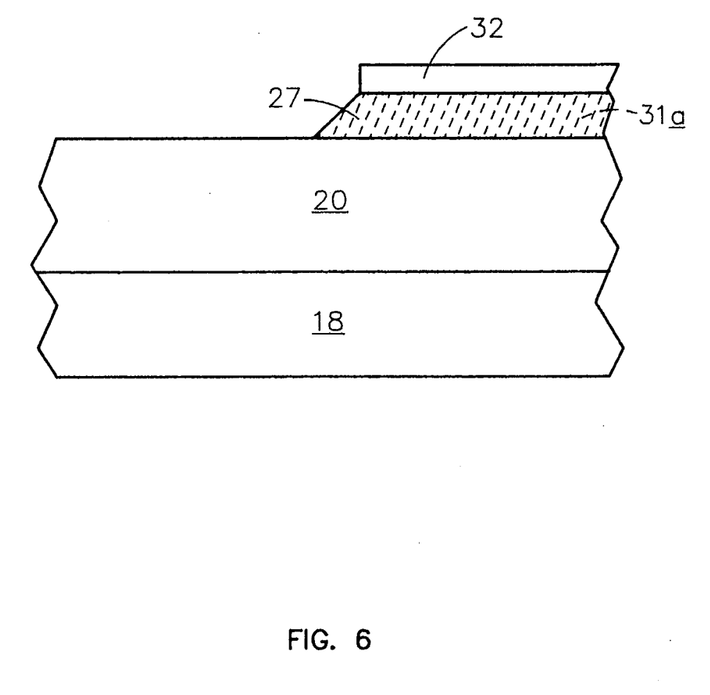

Turning attention now to FIG. 6, glass layer 31 is etched conventionally to produce previously mentioned island 27, with the sloped overbeveled margin mentioned earlier.

Figure 7:
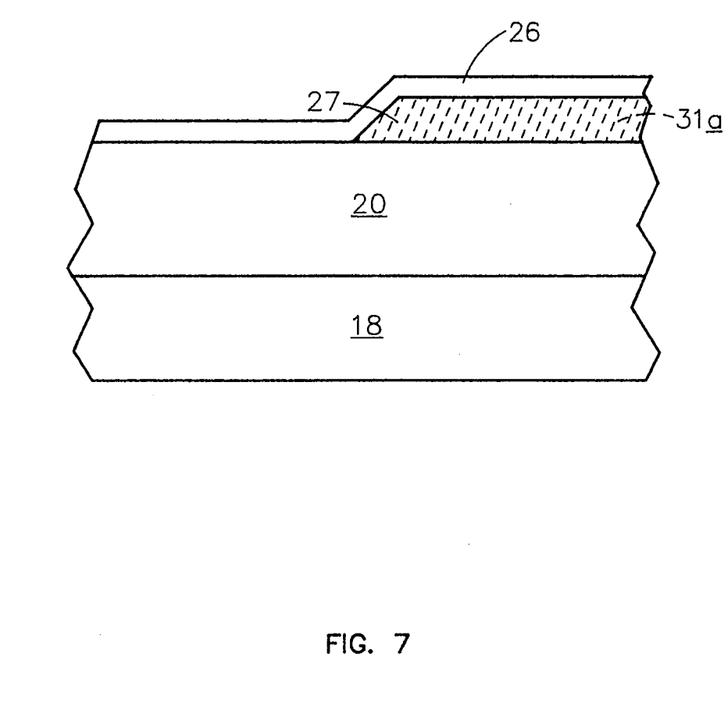

The next step in the manufacture of transistor 10 is seen in FIG. 7, where gate-oxide layer 26 is suitably formed over island 27 and over the upper surface of layer 20 after removal of photoresist layer 32. This layer has a thickness herein of about 1500-Angstroms.

Figure 8:
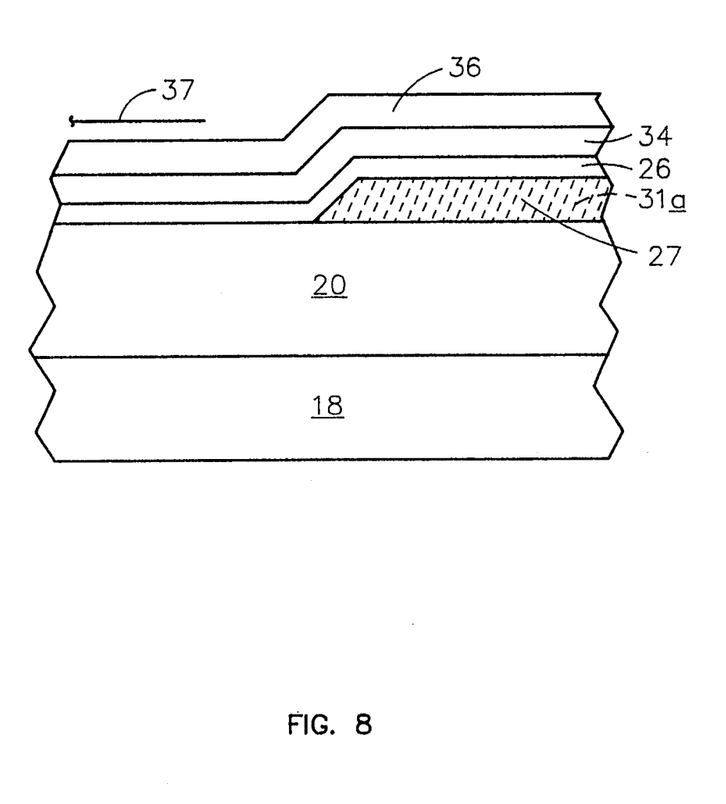
Figure 9:
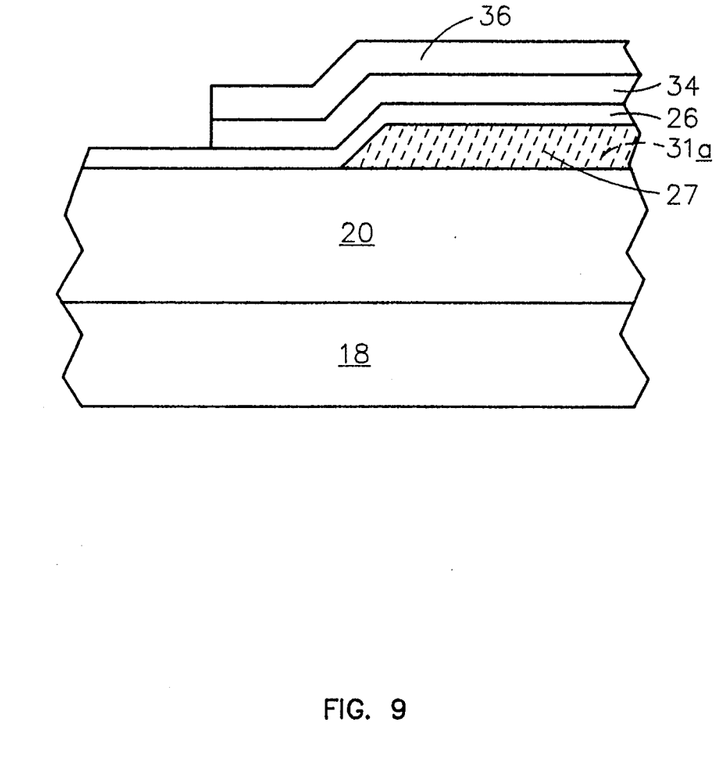

FIG. 8 illustrates the next three successive steps. The first of these involves conventional chemical vapor deposition of a layer 34 of polysilicon, with a thickness of roughly 7000-Angstroms. While, for reasons not relating to the present invention, polysilicon is a preferred material for layer 34, others which may be used include silicon nitride, refractory-metal silicide, and doped oxides. Then, conventionally formed over layer 34 is a negative photoresist layer 36.

The third step illustrated in FIG. 8 involves conventional masking to produce the overall layout of transistor 10. A portion of an appropriate mask is shown fragmentarily at 37. Through conventional photolithography, photoresist layer 36 is exposed to light and then, in one of the steps illustrated in FIG. 9, developed to remove photoresist from layer 36 in the areas not exposed to light. The next step, illustrated in FIG. 9, involves etching of polysilicon layer 34 to produce a pattern therein matching the open pattern developed in layer 36.

Figure 10:
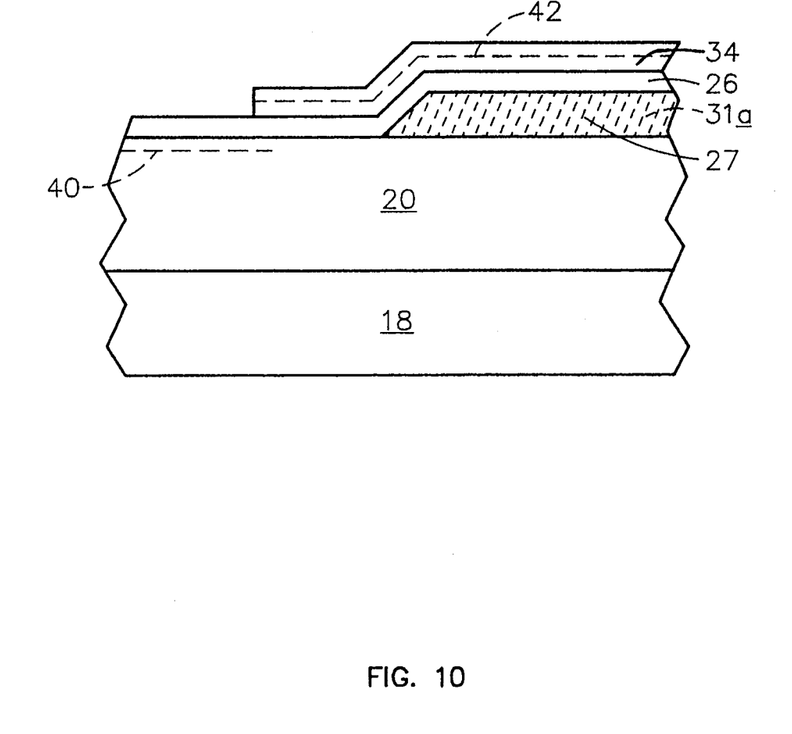

Turning attention now to FIG. 10, the next step which is performed is the removal of photoresist layer 36, and accordingly this layer is absent in FIG. 10. What then follows, as is illustrated in FIG. 10, is a first implant step, which takes the form of a boron implant that will result, as will be explained, in previously mentioned layer 22. The boron implant step is performed in a conventional implanter at an energy level of about 160-KEV to produce the desired implant density in layer 20. Dashed line 40 in FIG. 10 illustrates the material implanted in layer 20 by this step. Dashed line 42 illustrates that there is some penetration of boron into layer 34, but not a complete penetration of this layer.

Figure 11:
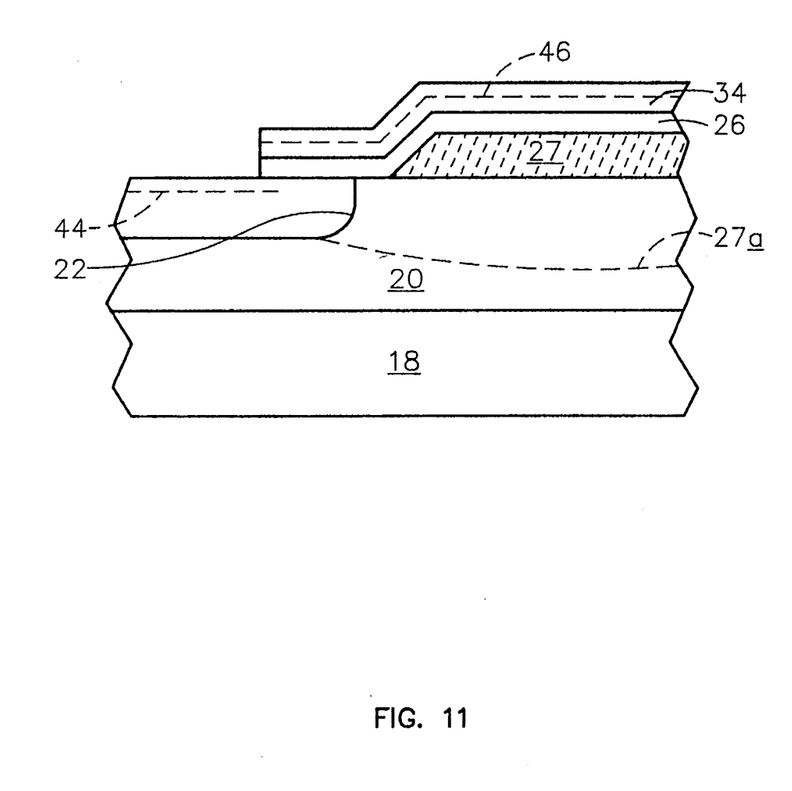

FIG. 11 illustrates the next three steps in the manufacture of transistor 10. The first step performed is a diffusion step to diffuse the implanted boron into layer 20 while at the same time driving boron dopant in island 27 also into layer 20 to form doped subregion 27a. This diffusion step takes place in a conventional diffusion furnace at a typical temperature of about 1150° C. for about 3–8-hours. What results from this step is the beginning of previously described layer 22, and, of course, doped subregion 27a. An important contribution which is made by the overbeveled margin of island 27 is that, progressing outwardly along the island to its terminal edge, less and less dopant becomes available for driving into layer 20. As a consequence, this shape in island 27 results in a penetration profile for subregion 27a which leads to smoothly joining boundary interfaces with layer 22.

Still with reference to FIG. 11, next, layer 26 is etched, by any commercial etching technique, to transfer thereinto a matching pattern of the openings present in polysilicon layer 34. Finally illustrated in FIG. 11 is a second implant step where phosphorous is implanted, again in a conventional implanter at an energy level about 160-KEV. Dashed line 44 illustrates the material implanted in the upper portion of layer 22, and dashed line 46 illustrates some penetration of the phosphorous into layer 34.

Figure 12:
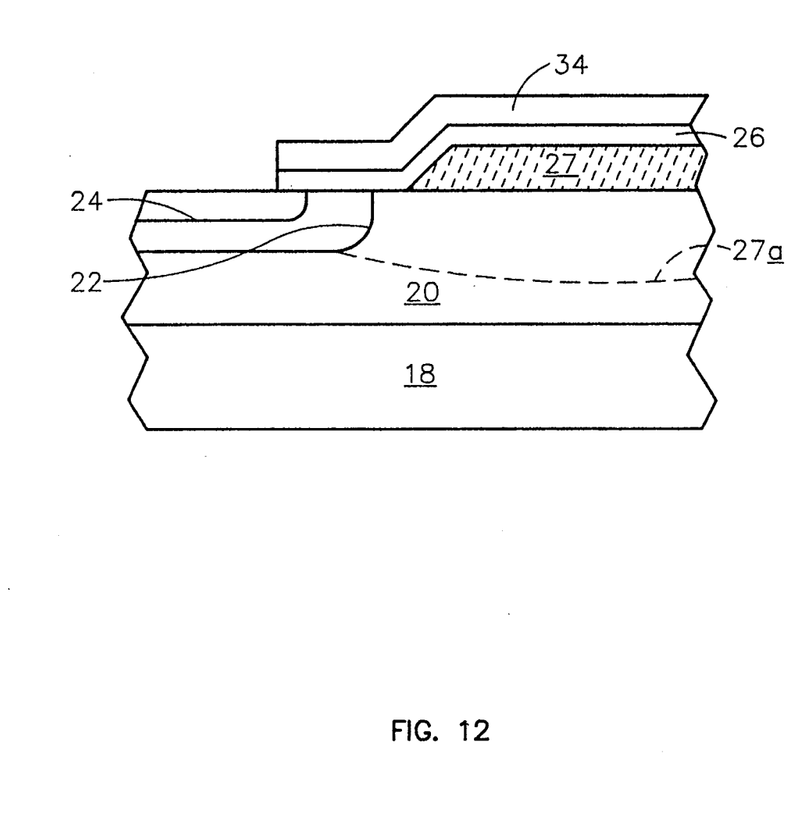

FIG. 12 illustrates the second and final diffusion step which also takes place in a conventional diffusion furnace, typically at a temperature of about 1,100° C. for about 1–3 hours. What, as a consequence, results completely within the boundaries of layer 22 is a new diffused region which will result, ultimately, in previously described layer 24.

During the diffusion step just described, a thin oxide film (not shown) grows incidentally on the surface of layer 20, and the next step in the manufacturing procedure is to remove this thin oxide layer by any suitable conventional etching technique.

Figure 13:
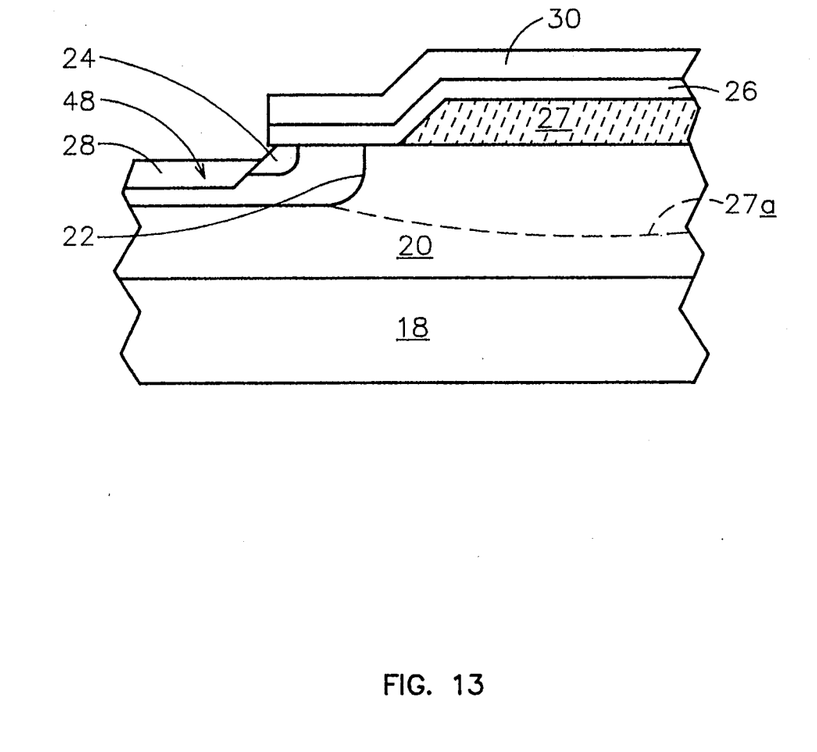

FIG. 13 illustrates the final steps in the preparation of transistor 10. The first of these involves the controlled etching of the slope-walled trench shown generally at 48 in FIG. 13. This etch also results, desirably, in the removal of polysilicon layer 34.

The final step to be described herein involves metalization, wherein aluminum is preferably cold-evaporated to create source layer 28 and gate layer 30. The tapered edges of island 27 assure that layer 30, without discontinuities, covers the entirety of gate-oxide layer 26.

Thus, transistor 10 has been prepared with a specially doped subregion which obviates the problem of electrical breakdown that could otherwise occur in the region underlying the gate contact pad. The convenient use of a structure like island 27, predoped appropriately, as the carrier vehicle for dopant to drive into this region, yields a doped subregion which is properly profiled to minimize the creation of any new electrical breakdown problems.

Accordingly, while a preferred embodiment of the invention has been described, it should be understood that variations and modifications are possible without departing from the spirit of the invention.

It is claimed and desired to secure by Letters Patent:

1. A method for fabricating a vertical power-MOS transistor, comprising:
    providing a silicon substrate for fabricating a MOS transistor having a top surface;
    forming an island over a part of the silicon surface with a first dopant type;
    implanting a dopant of the same type residing in the island into the silicon on adjacent sides of the island;
    simultaneously diffusing the dopant on adjacent sides of the island further into the silicon to form first and second channel regions on opposite adjacent sides of the island and driving the dopant from the island down into the substrate to form a subregion in the silicon below the island, the subregion electrically connecting the adjacent channel regions to reduce the tendency for electrical breakdown in the transistor.

2. The method according to claim 1 including overbeveling the island margin so that the process of diffusing dopant on either side of the island and driving dopant from the island into the silicon create a smooth joining boundary interface between the first and second channel regions and the subregion.

3. A method for controlling electrical breakdown in a vertical power-MOS transistor, comprising:
    providing a power-MOS transistor having a set of associated channels with a given dopant type and a gate contact area, the gate contact area having an expanse thereunder that is at least partially bounded by said channels;
    electrically connecting the channels to reduce the build-up and concentration of electrical fields which tend to cause electrical breakdown.

4. The method of claim 3 wherein the channels are electrically connected by diffusing a dopant of the same type as the channels into the expanse beneath the gate contact area.

* * * * *